United States Patent [19]

Ouyang et al.

[11] Patent Number: 4,792,705
[45] Date of Patent: Dec. 20, 1988

[54] FAST SWITCHING CHARGE PUMP

[75] Inventors: Kenneth W. Ouyang, Huntington Beach; Melvin Marmet, Placentia, both of Calif.

[73] Assignee: Western Digital Corporation, Irvine, Calif.

[21] Appl. No.: 839,505

[22] Filed: Mar. 14, 1986

[51] Int. Cl.$^4$ .................. H01L 27/10; H03L 1/00; H03K 3/354
[52] U.S. Cl. .................. 307/296 R; 307/246; 307/585; 331/111
[58] Field of Search .................. 307/296 R, 297, 304, 307/246, 585, 579; 331/1 A, 111

[56] References Cited

U.S. PATENT DOCUMENTS

| | | | |
|---|---|---|---|
| 3,886,485 | 5/1975 | Takahashi | 331/111 |
| 3,904,988 | 9/1975 | Hsiao | 331/111 |
| 4,263,567 | 4/1981 | Astle | 331/111 |
| 4,321,561 | 3/1982 | Payne et al. | 331/111 |
| 4,375,596 | 3/1983 | Hoshi | 307/296 R |
| 4,439,692 | 3/1984 | Beekmans et al. | 307/304 |
| 4,553,047 | 11/1985 | Dillinger et al. | 307/297 |
| 4,692,717 | 9/1987 | Ouyang et al. | 331/111 |

Primary Examiner—Stanley D. Miller
Assistant Examiner—Tai V. Duong
Attorney, Agent, or Firm—Spensley Horn Jubas & Lubitz

[57] ABSTRACT

A charge pump implemented in a CMOS monolithic circuit provides a precise output charging current source or current sink with fast switching characteristics. Each of two CMOS output transistors is connected via a transmission gate to a transistor having a constant current flow through it. An MOS capacitor is connected to the gates of the constant current transistors. When a transmission gate is closed, the respective output transistor is coupled to the constant current transistor in a current mirror configuration. The output transistor is quickly switched on to cause a step change in output current.

14 Claims, 1 Drawing Sheet

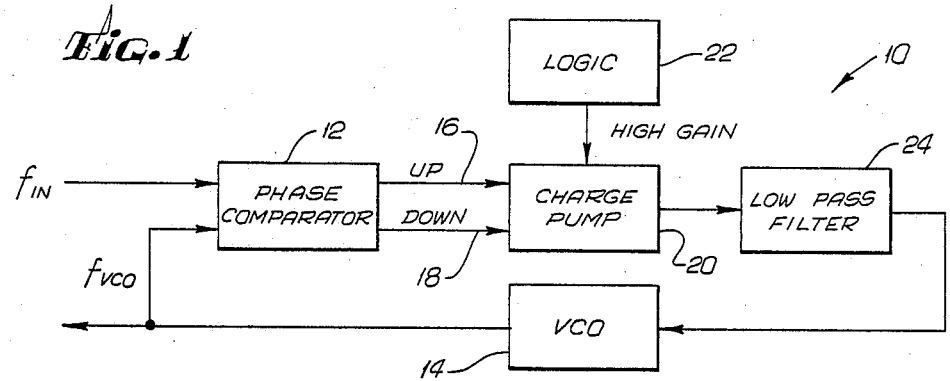
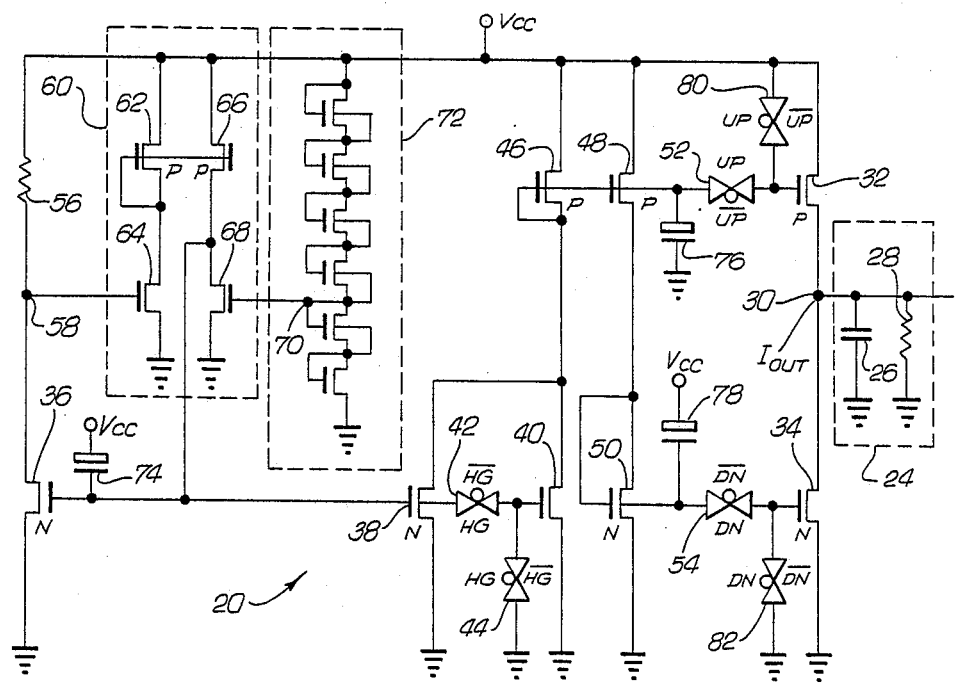
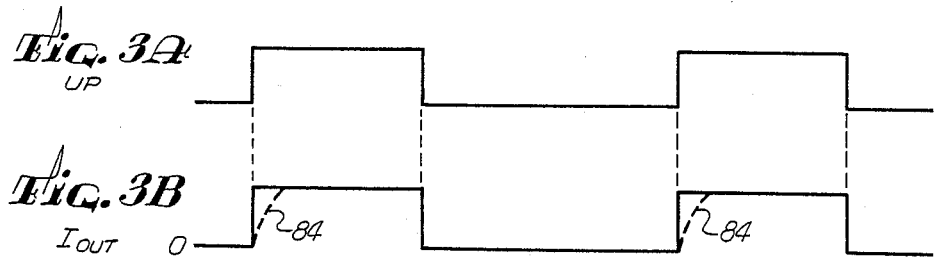

FAST SWITCHING CHARGE PUMP

BACKGROUND OF THE INVENTION

1. Field of the Invention

The present invention relates to a high speed switching current source or "charge pump" which operates as a current source to provide a charging current and as a current sink to discharge current. Typically, the output of the charge pump is connected to a capacitor which is charged and discharged by the charge pump in order to achieve a desired voltage level across the capacitor. In a typical application, the charge pump is used in a phase-locked loop system including a charge pump, low pass filter, voltage controller oscillator and phase detector. The phase detector compares the phase of an input signal with that of an output signal and generates a "charge up" or "charge down" signal to the charge pump depending upon the phase error. Current flow at the output of the charge pump is rapidly switched to provide either a current source or a current sink to charge or discharge a capacitor which is part of the low pass filter. The voltage across the capacitor is applied to the voltage controlled oscillator to adjust the frequency until the output of the VCO is phase and frequency locked to the input signal.

In order to achieve proper charging and discharging of the capacitor, the charge pump must have the ability to rapidly switch the charge or discharge current on and off. Otherwise, the rate of charging or discharging of the capacitor will not be constant. Thus, it is desirable that the output characteristics of the charge pump will be such that the current output is a step function so that the capacitor will charge and discharge at a fixed rate.

2. Description of the Prior Art

Typically, a charge pump includes output current transistors to provide the desired current sink or source operation. Additional switching transistors or transfer gates are located in the output current path and are switched to couple the desired output transistor to the output terminal of the charge pump. This introduces both parasitic resistance and capacitance, thus slowing the switching speed of the device. In addition, the large transfer gates need to charge up to the full power supply level, thus further slowing down the turn on time.

A phase-locked loop system incorporating a charge pump is illustrated in U.S. Pat. No. 4,208,075 to Wessler. The charge pump generates a positive or negative phase difference signal, which represents operation as a current sink or source, which is applied to a low pass filter circuit. Switched current sources are also disclosed in U.S. Pat. Nos. 3,886,485 to Takahashi and 3,904,988 to Hsiao. These patents are directed to voltage controlled oscillators which include a timing capacitor charged and discharged by a current source generator which may be switched to operate as a sink or source. In the Hsiao patent in particular, the switching means used to select current sink or source operation is located in the output current path and thus is subject to the disadvantages described above. Although these circuits are acceptable for many applications, faster switching speeds are necessary for more critical applications. In particular, phase-locked loops employed in data separators or Winchester discs operate at approximately 10 MHz and therefore require extremely fast switching charge pumps. The present invention is directed to a charge pump capable of providing the high switching speed necessary for such applications.

SUMMARY OF THE INVENTION

The present invention is directed to a charge pump having output transistors connected directly to the output terminal of the charge pump and without any switching means being located in the output current path. Instead, switching is controlled by means of transmission gates located between current mirror transistors and the output transistors. In order to ensure rapid switching despite the large input capacitance of the output transistors, capacitors are connected to the gates of the current mirror transistors. The provision of the capacitors eliminates charge redistribution problems which would otherwise occur upon closing of the transmission gates. In the preferred embodiment of the invention, the charge pump is implemented in a CMOS monolithic structure and the capacitors are MOS capacitors. Only a single external component is required, namely, a resistor employed to determine the value of the current output of the charge pump.

BRIEF DESCRIPTION OF THE DRAWINGS

The invention will be described with reference to the accompanying drawings, wherein:

FIG. 1 is a block diagram of a phase-locked loop system employing a charge pump according to the present invention;

FIG. 2 is a schematic diagram of the charge pump of the present invention; and

FIGS. 3a and 3b are waveform diagrams of a charge up input signal and resulting output current, respectively.

DESCRIPTION OF THE PREFERRED EMBODIMENT

The following description is of the best presently contemplated mode of carrying out the invention. This description is made for the purpose of illustrating the general principles of the invention and is not to be taken in a limiting sense. The scope of the invention is best determined by reference to the appended claims.

Referring to FIG. 1, a phase-locked loop system 10 includes a phase detector or comparator 12 which compares the phase of an input signal with the output of a voltage controlled oscillator (VCO) 14. The phase-locked loop operates to adjust the voltage input to the VCO 14 until its output is locked in frequency and phase with the input signal. The phase error is determined by the phase comparator 12 and a pulse output of duration corresponding to the error is generated on an "up" line 16 or a "down" line 18. These signals are applied to a charge pump 20 which operates as a current source in response to the up signal and a current sink in response to the down signal. Logic circuitry 22 generates a control signal to the charge pump 20 to determine the value of the output current. Before phase locking is achieved, a high gain signal is applied to cause a large output current to be generated to rapidly achieve locking. After locking has been achieved, the high gain signal is removed and a lower current level is generated to improve stability.

The output of the charge pump 20 is applied to a low pass filter 24 which includes a capacitor which is charged and discharged by the charge pump 20. The voltage across the capacitor is applied as the input to the voltage controlled oscillator 14. The charge pump operates to vary the voltage across the capacitor until phase locking is achieved, at which point neither up nor down error signals will be generated.

The charge pump is illustrated in FIG. 2. The low pass filter 24 is illustrated as including a capacitor 26 and a resistor 28. The capacitor 26 has one terminal connected to the output terminal 30 of the charge pump. A P-type MOS transistor 32 has its drain connected to the output terminal 30 and its source connected to a supply voltage Vcc. An N-type MOS transistor 34 has its drain connected to the point 30 and its source connected to ground. The transistors 32 and 34 form a CMOS output pair, with only one of the transistors being turned on at a time. In order to charge the capacitor 26, the transistor 32 is turned on to provide a current source, whereas to discharge the capacitor the transistor 34 is turned on to provide a current sink.

For optimum charge pump operation, the transistors 32 and 34 must be controlled to achieve a precise current value at the output terminal 30 and must be rapidly switched at both turn on and turn off. Any delay in switching results in the improper level of current at the output terminal 30 for some period of time, thus resulting in an undesired charging or discharging rate for the capacitor 26. The circuitry of FIG. 2 ensures both fast switching and precise current levels.

The present invention employs current mirror techniques to achieve the precise current levels required. Specifically, an N-type transistor 36 is driven so as to have a constant current flowing through it. An N-type transistor 38 is connected to the transistor 36 in a current mirror configuration, i.e., their gates are interconnected and sources both connected to ground, and the current through the transistor 38 thus equals the current through the transistor 36. An N-type transistor 40 is connected to the transistor 38 in a current mirror configuration via a transmission gate 42, and when the transmission gate 42 is closed the current through the transistor 40 will thus equal the current through the transistor 38. When the transmission gate 42 is opened a transmission gate 44 is closed to connect the gate at the transistor 40 to ground. A P-type transistor 46 has its drain connected to the drains of the transistors 38 and 40 and its source connected to the power supply Vcc. The current through the transistor 46 will thus equal either the current through the transistor 38 alone or the sum of the currents through the transistors 38 and 40 (when the transmission gate 42 is closed), assuming all of the transistors are the same size. Thus, a fixed current of one of two values will flow through the transistor 46 and will be proportional to the constant current through the transistor 36.

A P-type transistor 48 is coupled to the transistor 46 in a current mirror configuration, i.e., their gates are interconnected and source are both connected to the power supply, and the current through the transistor 48 will therefore equal that through the transistor 46 (again assuming they are the same size). This current also passes through an N-type transistor 50 whose drain is interconnected with the drain of the transistor 48. Thus, a constant current of one of two levels (depending upon whether the transistor 40 is switched) will flow through the transistors 48 and 50.

The transistors 48 and 50 are interconnected to the output transistors 32 and 34, respectively, in a current mirror configuration via transmission gates 52 and 54. The output transistors 32 and 34 in the present embodiment are ten times larger than the transistors 48 and 50 and the current through them will therefore be proportionately larger. Thus, when the transmission gate 52 is closed, the transistor 32 will be interconnected with the transistor 48 in a current mirror configuration and a current ten times that through the transistor 48 will flow through transistor 32. Similarly, when the transmission gate 54 is closed a current ten times the level of the current through the transistor 50 will flow through transistor 34.

Thus, a constant current is maintained in the transistor 36 and by the use of current mirror techniques a proportional constant current is caused to flow through one of the output transistors 32 and 34 when it is switched on.

The circuitry of FIG. 2 is configured to overcome two problem areas, namely, the maintenance of a constant current and the avoidance of switching delay. With the exception of the capacitor 26, resistor 28 and a resistor 56, all of the elements of FIG. 2 are formed as part of a monolithic integrated circuit. However, a constant current will be maintained through the transistor 36 despite process variations in forming the integrated circuit. The external resistor 56 is connected between the supply voltage Vcc and the drain of the transistor 36 at a terminal 58. The voltage at this terminal is applied to one input of a comparator 60 which includes transistors 62, 64, 66 and 68. The other input to the comparator is a reference voltage obtained at point 70 by means of a voltage divider network 72 including six transistors. The output of the comparator is coupled to the gate of the transistor 36 and will drive the transistor 36 until the voltages at the two inputs to the comparator are equal. Thus, with the voltage at point 58 equal to the reference voltage at point 70, a constant current flow through the resistor 56 and thus through the transistor 36. This current is independent of process variations and is as follows:

$$I_{bias} = \frac{V_{cc} - V_{gs64}}{R56} = \frac{\tfrac{3}{8}V_{cc}}{R56}$$

An MOS capacitor 74 is connected to the gate of the transistor 36 so as to stabilize the feedback loop and reduce noise. The use of N-type FETs of diode connection with their P-wells tied to the source to eliminate body effect results in a precise reference voltage from the network 72. A precise constant current will therefore be maintained through the transistor 36 with the resultant desired output current level from the output transistors 32 and 34.

The present invention eliminates any switching devices in the output current path. Instead, the transmission gates 52 and 54 are employed to switch the charge pump to achieve current sourec or current sink operation. In conjunction with MOS capacitors 76 and 78, extremely fast switching can be achieved. Since the transistors 32 and 34 are relatively large, they have a large input capacitance. In the absence of the capacitors 76 and 78, when a transmission gate is closed, charge redistribution from the transistor 48 to the transistor 32 or the transistor 50 to the transistor 34 would cause a relatively slow voltage rise at the input to the transistors 32 and 34, thus causing them to switch on relatively slowly. The addition of the capacitors 76 and 78 stores a charge to provide an instantaneous rise in voltage at the gates of the transistors 32 and 34 when the transmission gates are closed. Thus, a fast voltage change at the input of the transistors 32 and 34 can be achieved despite their large input capacitance.

Although the capacitor 76 is shown as being connected to ground and the capacitor 78 as being connected to the power supply Vcc, it should be noted that either capacitor could be connected to either potential. All that is required is that a sufficient voltage be applied to the gate to achieve proper MOS capacitor operation.

In addition to the transmission gates 52 and 54, additional transmission gates 80 ad 82 are provided to ensure rapid turn off of the transistors 32 and 34. These transmission gates operate alternately with the gates 52 and 54, i.e., when the gate 52 is closed the gate 80 will be open and vice versa and when the gate 54 is closed the gate 82 will be open and vice versa.

Referring to FIG. 3, the transmission gate 52 is closed by the signal UP on line 16 whereas the transmission gate 80 is closed by the complement of the signed UP obtained by means of a converter (not shown). When the UP signal goes high, the gate 52 closes, thus rapidly turning on the transistor 32 and causing the output current Iout at terminal 30 to rapidly rise, as shown in FIG. 3b. Thus, the pulse signal UP translates to a step change in the current at the output terminal 30. In the absence of the capacitor 76, the current output would rise much more slowly, as indicated by a dahsed line 84 in FIG. 3b. By providing a step change in the output current, the capacitor 26 of the low pass filter 24 will be charged up at the proper rate.

When the UP signal is removed, the transmission gate 52 will be opened and the transmission gate 80 closed to quickly turn off the transistor 32 and cause the output current at terminal 30 to return to zero. Thus, fast switching is achieved both for turn on and turn off of the transistor 32.

When current sink operation is called for, the down signal on line 18 goes high, thus closing the transmission gate 54 and turning on the transistor 34. A fixed current thus flows at the terminal 30 through the transistor 34, thus discharging the capacitor 26 at a precise rate.

The logic circuit 22 shown in FIG. 1 provides the high gain signal and its complement to the transmission gates 42 and 44 to determine if high gain operation is desired, in which case the transmission gate 42 is closed to turn on the transistor 40 and double the ultimate output current.

Although the present embodiment of the invention employs transmission gates as switching elements, the invention is not so limited. Other switching means may be employed to control the connection of the gates of the output transistors as well as the high gain transistor 40. The primary requirement is that the switching means remain outside of the output current path.

What is claimed is:

1. A high speed charge pump comprising:
a reference field effect transistor for conducting a reference current;
a capacitor for storing a gate biasing charge therein which is proportional to the value of the reference current;
gate voltage generating means, coupled to the gate of the reference field effect transistor, for generating a gate biasing voltage thereat corresponding to the reference current being conducted by the reference field effect transistor;
an output field effect transistor having a gate of larger capacitance than the gate of the reference field effect transistor, the output field effect transistor being connected such that it is a current-mirroring replica of the reference field effect transistor; and
switch means, interposed between the capacitor and the gate of the output field effect transistor, for selectively applying the gate biasing charge of the capacitor to the gate of the output field effect transistor to thereby switch the output field effect transistor on.

2. The high speed charge pump of claim 1 wherein the reference and output field effect transistors are both fabricated on a monolithic integrated circuit.

3. The high speed charge pump of claim 1 further comprising a shorting means, coupled to the gate and source of the output field effect transistor, for selectively shorting the gate of the output field effect transistor to the source of that transistor to thereby turn the output field effect transistor off.

4. A fast switching charge pump, comprising:
first and second voltage sources;
first output transistor means having a supply terminal connected to the first voltage source, a control terminal and an output terminal;
second output transistor means having a supply terminal connected to the second voltage source, a control terminal and an output terminal connected to the output terminal of the first transistor means at an output terminal of the charge pump;
first switch means having one terminal connected to the control terminal of the first output transistor means;
second switch means having one terminal connected to the control terminal of the first output transistor means and a second terminal connected to the first voltage source;
a first capacitor connected between one of the voltage sources and a second terminal of the first switch means;
third transistor means having a control terminal connected to the second terminal of the first switch means and having a supply terminal connected to the first voltage source whereby when the first switch means is closed the control terminal of the third transistor means will be coupled to the control terminal of the first output transistor means to provide a current mirror configuration;
third switch means having one terminal connected to the control terminal of the second output transistor means;
fourth switch means having one terminal connected to the control terminal of the second output transistor means and a second terminal connected to the second voltage source;
a second capacitor connected between one of the voltage sources and a second terminal of the third switch means;
fourth transistor means having a control terminal connected to the second terminal of the third switch means and having a supply terminal connected to the second voltage source whereby when the second switch means is closed the control terminal of the fourth transistor means will be connected to the control terminal of the second output transistor means to provide a current mirror configuration;
constant current means, coupled to the third and fourth transistor means, for causing a constant and equal current to flow through the third and fourth transistor means; and switching control means for (a) closing the first and fourth switch means and opening the second and third switch means to provide a current source at the output terminal and (b) opening the first and fourth switches and closing the second and third switches to provide a current sink at the output terminal.

5. A charge pump according to claim 4 wherein the first voltage source provides a relatively high voltage and the second voltage source provides a relatively low voltage, the first and third transistor means each comprise a P-type field effect transistor, and the second and fourth transistor means each comprise an N-type field effect transistor.

6. A charge pump according to claim 4 wherein the switch means each comprise a transmission gate.

7. A charge pump according to claim 4 wherein the constant current means comprises a reference transistor and current control means for providing a signal to a control terminal of the reference transistor and causing a constant current to flow through the reference transistor, wherein the signal applied to the control terminal of the reference transistor is employed to cause a constant current to flow through the third and fourth transistor means.

8. A charge pump according to claim 7 wherein the current control means includes a comparator having a reference voltage applied to one input thereof, a resistor having one terminal connected to a supply terminal of the reference transistor and a second terminal connected to the first voltage source, wherein the voltage at the second terminal is applied to a second input of the comparator and wherein the output of the comparator is applied to the control terminal of the reference transistor to drive the reference transistor so that the voltage at the second terminal of the comparator is equal to the voltage at the first terminal of the comparator, whereby the current through the reference transistor is maintained at a constant value.

9. A charge pump according to claim 4 further comprising gain control means, operatively coupled to at least one of third and fourth transistor means, for controlling the value of current at the output terminal of the charge pump.

10. A fast switching CMOS charge pump comprising:
a power supply connected to ground;
a first MOS transistor of a first conductivity type having a first electrode connected to ground, a second electrode connected to an ouput terminal of the charge pump, and a control electrode;
a second MOS transistor of a second conductivity type having a first electrode connected to the power supply, a second electrode connected to the output terminal and a control electrode;
a third MOS transistor of the first conductivity type having a first electrode connected to ground, a second electrode and a control electrode connected to the second electrode;
a fourth MOS transistor of the second conductivity type having a first electrode connected to the power supply, a second electrode connected to the second electrode of the third transistor and a control electrode;
means for causing a constant current to flow through the fourth transistor and therefore through the third transistor;
a first capacitor connected between the control electrode of the third transistor and the power supply;
a second capacitor connected between the control electrode of the fourth transistor and the power supply;
first switch means for selectively connecting the control electrode of the first transistor to the control electrode of the third transistor to form a current mirror; and
second switch means for selectively connecting the control electrode of the second transistor to the control electrode of the fourth transistor to form a current mirror, wherein when the first switch means is closed the first transistor will turn on to provide a current sink at the output terminal and when the second switch means is closed the second transistor will turn on to provide a current source at the output terminal, wherein the first and second capacitors enable the first and second transistors to rapidly turn on to ensure that current at the output terminal will change in a stepwise manner.

11. A charge pump having a first output transistor of first conductivity type and a second output transistor of second conductivity type, said transistors having output electrodes coupled to each other at an output terminal, said first transistor having a supply electrode coupled to ground and said second transistor having a supply electrode coupled to a power supply, wherein the first transistor is turned on to sink current from the output terminal to ground and the second transistor is turned on to source current to the output terminal, wherein the charge pump includes means for controlling the switching of the output transistors comprising a third transistor having a first electrode connected to ground, a fourth transistor having a first electrode connected to the power supply and a second electrode connected to a second electrode of the third transistor, constant current means, coupled to the third and fourth transistors, for causing a constant and equal current to flow thorugh the third and fourth transistors, first switch means connected to couple a control electrode of the first transistor with a control electrode of the third transistor, second switch means connected to couple a control electrode of the second transistor with a control electrode of the fourth transistor, a first capacitor having a terminal connected to the control electrode of the third transistor and to the first switch means and a second capacitor having a terminal connected to the control electrode of the fourth transistor and to the second switch means, wherein the first switch means is closed to turn on the first transistor and the second switch means is closed to turn on the second transistor, said capacitors ensuring rapid switching of the transistors, wherein the value of the current through the third and fourth transistors determines the value of the current through the first and second output transistors.

12. A charge pump according to claim 11 wherein the constant current means includes means for causing the current through the third and fourth transistors to equal one of two different values, thereby controlling the value of the current through the output transistors.

13. A charge pump according to claim 12 wherein the constant current means includes:
a fifth transistor having a first electrode connected to the power supply, a second electrode and a control electrode connected to the control electrode of the fourth transistor;
sixth and seventh transistors each having a first electrode connected to ground, a second electrode connected to the second electrode of the fifth transistor, and a control electrode;

third switch means for switchably connecting the control electrode of the seventh transistor either to the control electrode of the sixth transistor or to ground;

an eighth transistor having a first electrode connected to ground, a second electrode, and a control electrode connected to the control electrode of the sixth transistor; and control means connected to the second and control electrodes of the eighth transistor for causing the current through the eighth transistor to be maintained at a constant level, whereby the current through the sixth transistor is porportional to the current through the eighth transistor, and when the third switch means is switched to connect the control electrodes of the sixth and seventh transistors the current through the seventh transistor is proportional to the current through the sixth transistor, wherein the current through the fifth transistor is equal to the sum of the currents through the sixth and seventh transistors.

14. A charge pump according to claim 13 wherein the control means includes a resistor connected between the power supply and the second terminal of the eighth transistor, and a comparator means, coupled to the second terminal of the eighth transistor and to a reference voltage, for comparing the voltage at the second terminal of the eighth transistor with the reference voltage and driving the control electrode of the eighth transistor so that the compared voltages are equal, thereby establishing a constant current through the resistor and eighth transistor.

* * * * *